(12) United States Patent
Sridhara et al.

(10) Patent No.: US 10,379,972 B1
(45) Date of Patent: Aug. 13, 2019

(54) MINIMIZING READS FOR REALLOCATED SECTORS

(71) Applicant: Seagate Technology LLC, Cupertino, CA (US)

(72) Inventors: Deepak Sridhara, Longmont, CO (US); Ara Patapoutian, Hopkinton, MA (US); Prafulla B Reddy, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 276 days.

(21) Appl. No.: 15/341,621

(22) Filed: Nov. 2, 2016

(51) Int. Cl.
G06F 11/00 (2006.01)
G06F 11/16 (2006.01)
G06F 11/10 (2006.01)
H03M 13/15 (2006.01)
H03M 13/19 (2006.01)

(52) U.S. Cl.
CPC ............ *G06F 11/167* (2013.01); *G06F 11/10* (2013.01); *G06F 11/1016* (2013.01); *G06F 2207/5354* (2013.01); *H03M 13/15* (2013.01); *H03M 13/151* (2013.01); *H03M 13/19* (2013.01)

(58) Field of Classification Search
CPC .... G06F 11/167; G06F 11/1016; G06F 11/10; G06F 2207/5354; H03M 13/15; H03M 13/151; H03M 13/19; H04L 1/0057
USPC .................................................. 714/752, 759
See application file for complete search history.

(56) References Cited

U.S. PATENT DOCUMENTS

| | | | |
|---|---|---|---|
| 5,769,380 A | 3/1998 | Shioyama et al. | |
| 5,937,435 A * | 8/1999 | Dobbek | G11B 20/1883 711/202 |
| 6,034,831 A * | 3/2000 | Dobbek | G11B 19/04 360/31 |
| 6,239,931 B1 * | 5/2001 | Chung | G11B 20/1883 360/53 |
| 6,295,176 B1 * | 9/2001 | Reddy | G11B 20/1883 360/48 |
| 6,470,461 B1 * | 10/2002 | Pinvidic | G11B 20/1883 714/6.13 |
| 6,539,496 B1 * | 3/2003 | Peters | G11B 19/04 714/16 |
| 7,949,927 B2 | 5/2011 | Park et al. | |

(Continued)

OTHER PUBLICATIONS

Robertson et al., Hard Disk Drive Having Dynamic In-Line Sparing, Application No. WO9803970, Jan. 29, 1998, 25 pages.

*Primary Examiner* — Albert Decady
*Assistant Examiner* — Osman M Alshack
(74) *Attorney, Agent, or Firm* — Cesari & Reed LLP; Kirk A. Cesari

(57) ABSTRACT

Systems and methods are disclosed for minimizing reads for reallocated sectors of a data storage medium. An apparatus may be configured to selectively skip over reallocated sectors in an LBA range without interrupting a read, via generating a skip mask or by beginning the read after the reallocated sector and reading the entire track up to the reallocated sector. When a number of sectors not read from the LBA range during the read operation is less than an amount of sectors that can be recovered based on an error correction capability, the data of the reallocated sector may be reconstructed using error correction data rather than by performing a read at the reallocated sector.

20 Claims, 6 Drawing Sheets

(56) References Cited

U.S. PATENT DOCUMENTS

| | | | |
|---|---|---|---|
| 8,274,749 B1* | 9/2012 | Pinvidic | G11B 5/59688 |
| | | | 360/48 |
| 8,892,807 B2* | 11/2014 | Brown | G06F 13/16 |
| | | | 711/103 |
| 2004/0128581 A1* | 7/2004 | Yoshida | G11B 20/1883 |
| | | | 714/6.13 |
| 2006/0080570 A1* | 4/2006 | Kim | G11B 20/1883 |
| | | | 714/6.13 |
| 2009/0019335 A1 | 1/2009 | Boyer et al. | |
| 2011/0022779 A1* | 1/2011 | Lund | G06F 12/0246 |
| | | | 711/103 |
| 2011/0131375 A1* | 6/2011 | Noeldner | G06F 12/00 |
| | | | 711/114 |
| 2013/0073922 A1 | 3/2013 | Varnica et al. | |
| 2015/0249471 A1 | 9/2015 | Yen et al. | |
| 2016/0191078 A1 | 6/2016 | Gilbert et al. | |

\* cited by examiner

MINIMIZING READS FOR REALLOCATED SECTORS

SUMMARY

In certain embodiments, an apparatus may comprise a circuit configured to perform a read operation on a logical block address (LBA) range, including selectively not reading one or more reallocated sectors of the LBA range. The circuit may determine whether a number of sectors not read from the LBA range is less than an amount of sectors that can be recovered based on an error correction capability, and when the number of sectors not read is less than the amount of sectors that can be recovered, reconstruct data of the one or more reallocated sectors using error correction data and do not read the data of the one or more reallocated sectors.

In certain embodiments, a method may comprise receiving a read request at a data storage device from a host for a logical block address (LBA) range, and performing a read operation to retrieve data from sectors stored to a first data track and corresponding to the LBA range, including selectively not reading a reallocated sector of the LBA range reassigned to a second data track. The method may include determining whether a number of sectors not read from the LBA range is less than an amount of sectors that can be recovered based on an error correction capability of the data storage device, and when the number of sectors not read is less than the amount of sectors that can be recovered, reconstructing data of the reallocated sector using error correction data and not reading the data of the reallocated sector.

In certain embodiments, an apparatus may comprise a hard disc drive, including an interface configured to connect to a host device, a disc storage medium having multiple data tracks, and a read channel. The read channel may be configured to perform a read operation on a logical block address (LBA) range stored to a first track of the disc storage medium in response to receiving a read request from the host device via the interface, including selectively not reading a reallocated sector of the LBA range reassigned to a second track of the data storage medium. The read channel may determine whether a number of sectors not read from the LBA range is less than an amount of sectors that can be recovered based on an error correction capability, and when the number of sectors not read is less than the amount of sectors that can be recovered, reconstruct data of the reallocated sector using error correction data and do not read the data of the reallocated sector.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
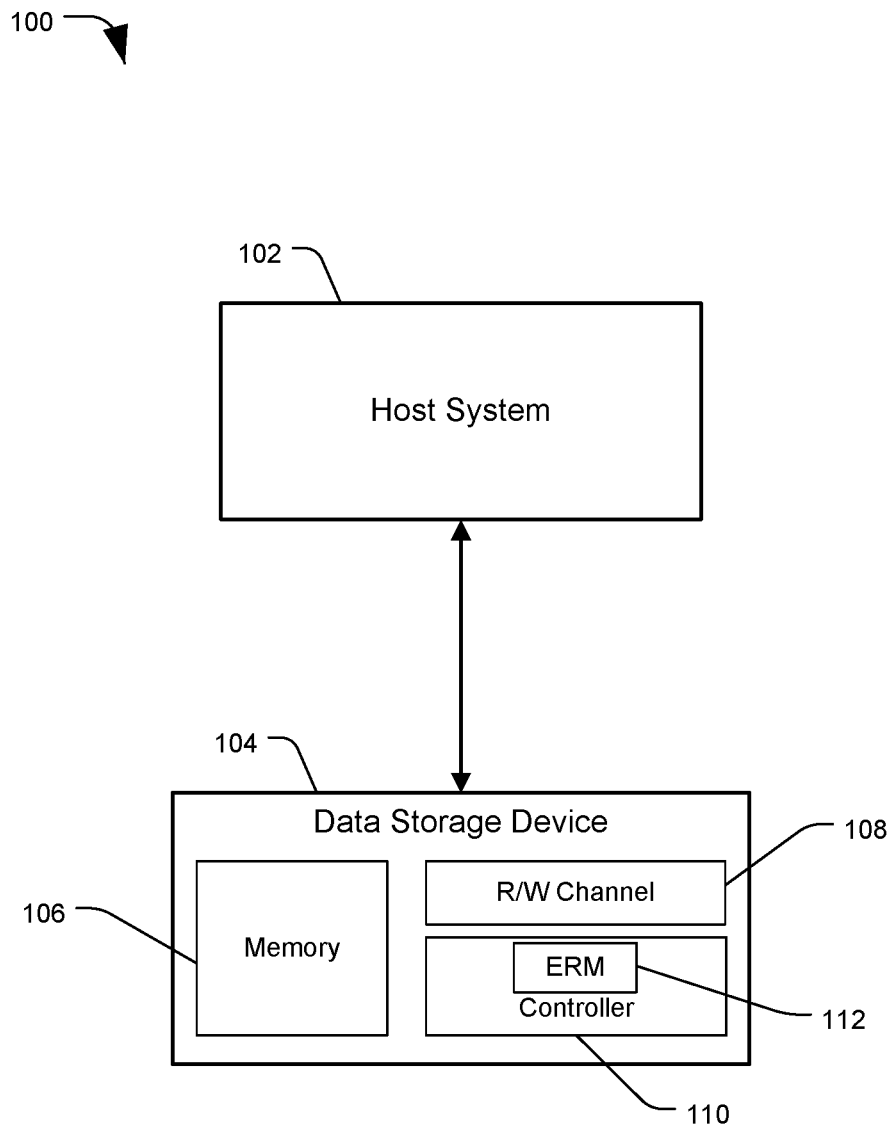
FIG. 1 is a diagram of a system configured to minimize reads for reallocated sectors, in accordance with certain embodiments of the present disclosure.

FIG. 1 is a diagram of a system, generally designated 100, configured to minimize reads for reallocated sectors, in accordance with certain embodiments of the present disclosure. The system 100 may include a data storage device (DSD) 104, such as a storage drive or any other device which may be used to store or retrieve data, such as a hard disc drive (HDD) or hybrid drive. The DSD 104 may include a memory 106, a read/write (R/W) channel 108, and a controller 110. The memory 106 may comprise one or more data storage mediums, such as magnetic storage media like disc drives, other types of memory, or a combination thereof. The R/W channel 108 may comprise one or more circuits or processors configured to process signals for recording to or reading from the memory 106. The controller 110 may be a processor or circuit configured to perform data access operations, such as reads or writes, to the memory 106. Data retrieved from the memory 106, or to be stored to the memory 106, may be processed via the R/W channel 108, such as encoding or decoding signals, detecting values from signal waveforms, or other processing.

The system 100 may optionally include a host device 102, which may also be referred to as the host system or host computer. The host 102 can be a desktop computer, a laptop computer, a workstation, a tablet computer, a telephone, a music player, another electronic device, or any combination thereof. The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive). The host 102 may issue data access requests, such as read or write requests, to the DSD 104. In response, the DSD 104 may perform data access operations on the memory 106 via the R/W channel 108 based on the requests.

The DSD 104 may also include an error recovery module (ERM) 112, which may be included in the controller 110, the R/W channel 108, or otherwise included in the DSD 106. The ERM 112 may be used to recovery data that could not be read during a read operation. When data is stored to the memory 106, such as user data, it may be stored with certain error recovery data or error correction code (ECC). ECC may include parity data and other information that can be used by the ERM 112 to mathematically reconstruct data that was not successfully read from the memory 106. For example, data on a memory 106 may include errors, either due to flaws in the physical storage medium, or due to errors that occurred when the data was written. If a number of bits of a sector were not successfully read, inner code (IC) stored to the sector may be used to recover the bits and obtain the data from the sector. Outer code (OC) may be distributed across all sectors of a track or other data segment, and may be used to recover sectors that are otherwise unrecoverable using inner code. Iterative outer code (IOC) may be a process of iterating between inner code recovery and outer code recovery to rebuild and recover data. As discussed herein, performing OC recovery may instead or also include performing IOC recovery. Other types of ECC are also possible. Various error correction algorithms may have a limit to how many errors can be corrected, for example based on how many error correction bits are stored per user data bits. This limit may be referred to as an "error correction capability" of the correction scheme or DSD 104. As an example, an OC error correction scheme employed by the DSD 104 may be capable of recovering four sectors of data per track. If more than four sectors on a track are unable to be read, the error correction may fail.

If errors occur during a writing process, rewriting the data to the sector may be sufficient to correct the errors. However, if errors arise due to defects in the storage medium, a sector may be designated as "bad" and no longer used to store data. If a physical sector is bad, the logical sector or address associated with the physical sector (sometimes called a logical block address, or "LBA") may be reallocated, reassigned, or remapped to a "spare" sector at a different location of the memory 106. "LBAs" and sectors, as used herein, may apply to units of storage utilized in disc storage mediums such as hard discs, solid state storage mediums such as Flash, or other data storage mediums.

Spare sectors prevent data from being lost due to storage to a bad sector, but storing data to a spare sector may present other problems. For example, data access operations at a hard disc drive may include mechanical latencies due to a need to position the transducer head over an appropriate track. Reallocated sectors may require additional access time to allow the DSD 104 to read part of the requested data from a first location, and then mechanically reposition the head to a second location to access the reallocated sector. An example embodiment of system 100, including a more detailed diagram of DSD 104, is depicted in FIG. 2.

Figure 2:
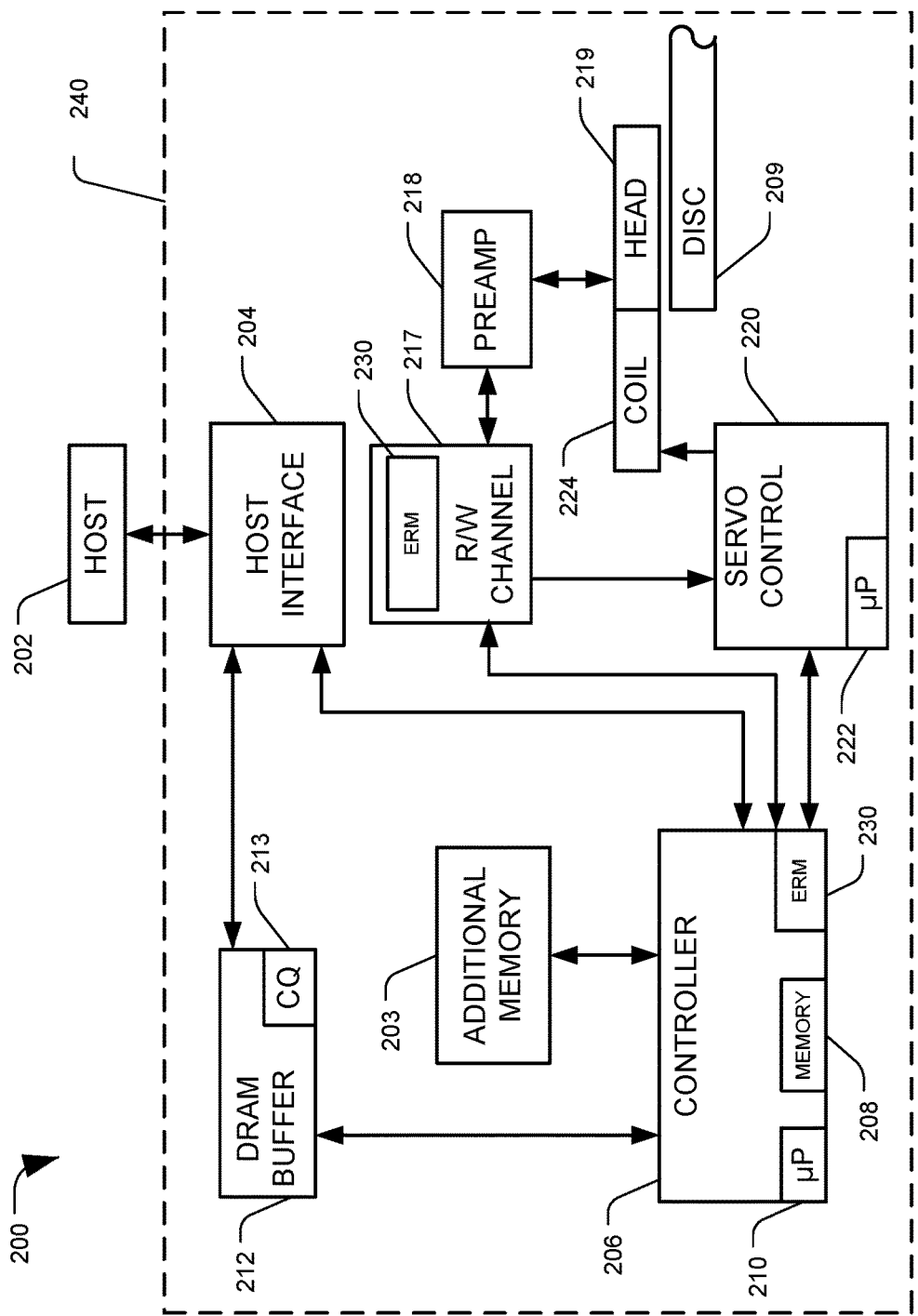
FIG. 2 is a diagram of a system configured to minimize reads for reallocated sectors, in accordance with certain embodiments of the present disclosure.

FIG. 2 is a diagram of a system 200 configured to minimize reads for reallocated sectors, in accordance with certain embodiments of the present disclosure. Specifically, FIG. 2 provides a functional block diagram of an example data storage device (DSD) 200. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector (not shown) that allows the DSD 200 to be physically removed from the host 202. The DSD 200 may have a casing 240 housing the components of the DSD 200, or the components of the DSD 200 may be attached to the housing, or a combination thereof. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. The controller 206 may control data access operations, such as reads and writes, to one or more disc memories 209. The DSD 200 may include an additional memory 203 instead of or in addition to disc memory 209. For example, additional memory 203 can be a solid state memory, which can be either volatile memory such as DRAM or SRAM, or non-volatile memory, such as NAND Flash memory. The additional memory 203 can function as a cache and store recently or frequently read or written data, or data likely to be read soon. Additional memory 203 may also function as main storage instead of or in addition to disc(s) 209. A DSD 200 containing multiple types of nonvolatile storage mediums, such as a disc(s) 209 and Flash 203, may be referred to as a hybrid storage device.

The DSD 200 can include a read-write (R/W) channel 217, which can encode data during write operations and reconstruct user data retrieved from a memory, such as disc(s) 209, during read operations. A preamplifier circuit (preamp) 218 can apply write currents to the head(s) 219 and provides pre-amplification of read-back signals. In some embodiments, the preamp 218 and head(s) 219 may be considered part of the R/W channel 217. A servo control circuit 220 may use servo data to provide the appropriate current to the coil 224, sometimes called a voice coil motor (VCM), to position the head(s) 219 over a desired area of the disc(s) 209. The controller 206 can communicate with a processor 222 to move the head(s) 219 to the desired locations on the disc(s) 209 during execution of various pending commands in the command queue 213. The DSD 200 may have two distinct channels for processing data sectors and servo sectors (e.g. a data channel and a servo channel), although in some embodiments a single channel may be used for both types of signal processing, or certain components may be shared by both channels. For example, the preamp 218 and R/W channel 217 may include components used when processing servo data, and the servo control 220 may also include components of the servo channel and perform servo signal processing.

DSD 200 may include an error recovery module (ERM) 230. The ERM 230 may perform the methods and processes described herein to recover or reconstruct data that was not successfully read by applying ECCs. The ERM 230 may also be configured to control or modify a read operation so as to minimize a number of reads required to complete the operation when a requested LBA range includes one or more reallocated sectors. When a read request is received (e.g. from host 202) including a requested range of LBAs, the ERM 230 may retrieve a list of reallocated sectors to compare against the requested LBA range. For example, during operation of the DSD 200 an address map or other reallocation information may be maintained in DRAM 212, memory 208, additional memory 203, or another location, allowing the DSD 212 to locate and retrieve requested data. If the requested LBA range includes one or more reallocated sectors, the ERM 230 may modify the read operation to minimize the required reads. A "read" may be when a read head 219 retrieves data from a data track of the disc 209 without interruption to reposition over another track. So a procedure that includes reading twenty LBAs from a first track, repositioning to a second track to read two more LBAs, and then repositioning back to the first track to read thirty more LBAs may be considered three "reads." Further, if a number of unread sectors during a read is less than an error correction capability of the ERM 230, the ERM may be configured to reconstruct data from a reallocated sector using error correction algorithms, rather than performing an additional read to retrieve the data from the reallocated sector.

The ERM 230 may be a processor, controller, or other circuit, or it may be a set of software instructions that, when executed by a processing device, perform the functions of the ERM 230. In some embodiments, the ERM 230 may be part of or executed by R/W channel 217, part of or executed by the controller 206, included in or performed by other components of the DSD 200, a stand-alone component, or any combination thereof. Example implementations of reading an LBA range including a reallocated sector are discussed in regard to FIG. 3.

Figure 3:
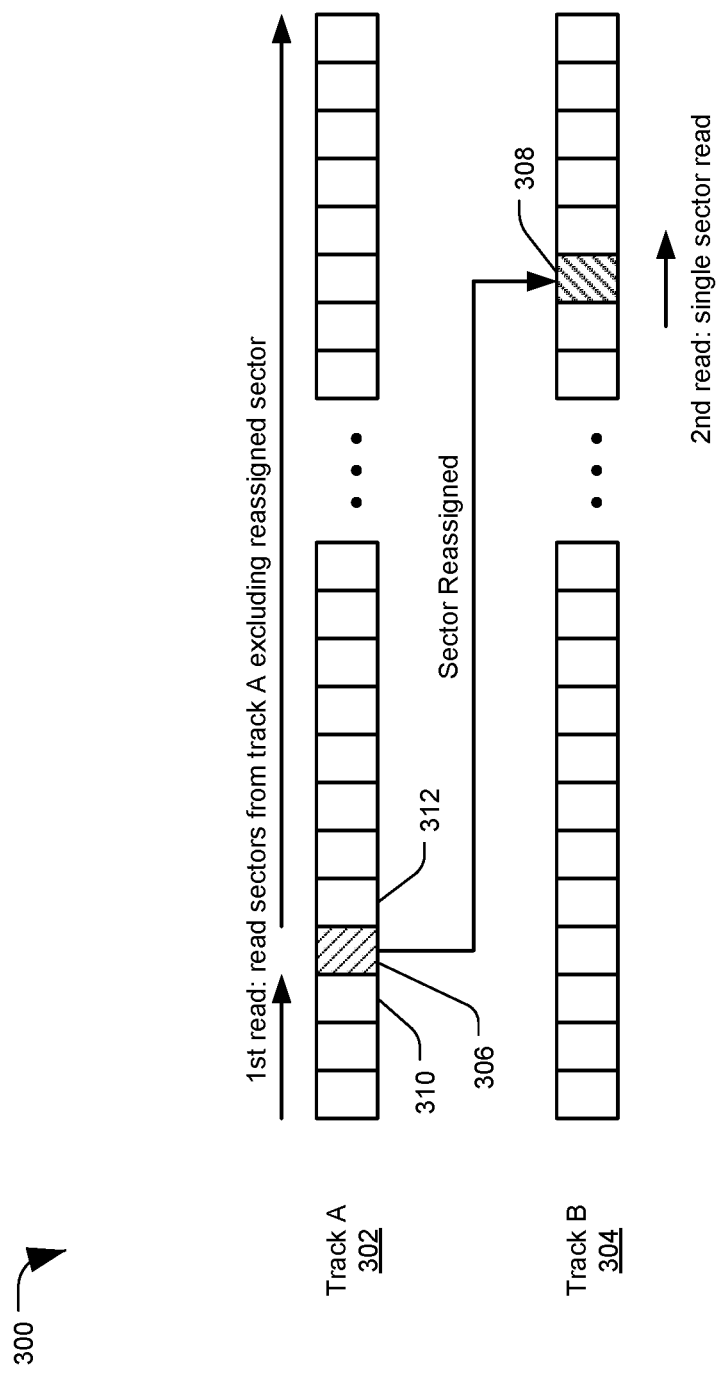
FIG. 3 is a diagram of a system configured to minimize reads for reallocated sectors, in accordance with certain embodiments of the present disclosure.

FIG. 3 is a diagram of a system configured to minimize reads for reallocated sectors, in accordance with certain embodiments of the present disclosure. In particular, FIG. 3 depicts an example set of tracks 300 of a data storage medium, such as a magnetic disc, with each track each including a plurality data sectors.

In the embodiment of FIG. 3, two tracks of a data storage medium are depicted: track A 302 and track B 304. Each track may include a plurality of sectors in which data may be stored. Each sector may be assigned a logical block address (LBA) used to identify what data is stored to each sector.

In some storage device implementations, for the majority of a storage medium, consecutive sectors may be assigned consecutive LBAs, such that a range of consecutive LBAs may be read or written during a single traversal of a track by a transducer head. Other portions of a storage medium may be reserved as spare sectors that are not initially assigned LBAs. When a bad sector is located, the LBA for that sector may be reassigned to one of the spare sectors. Accordingly, sectors in a spare region may not have consecutive LBAs, but instead have a collection of noncontiguous LBAs reassigned from various locations of the storage medium. Similarly, bad sectors in a contiguous area of the storage medium may result in discontinuities in the LBAs (e.g. LBAs 98, 99, 100, [bad sector], 102, . . . ).

In the depicted embodiment, track A 302 may be a track of contiguous LBAs, while track B 304 may include spare sectors to which bad sectors may be reassigned. Track A 302 may include a bad sector 306, which has been reassigned to sector 308 of track B 304. When a read operation is to be performed at track A 302 for a range of LBAs including the bad sector 306, the operation may be handled in a number of ways.

One approach may be to read sectors in strict uninterrupted LBA order. A first read may be performed that reads sectors up to sector 310, immediately preceding the bad sector 306. The DSD may then move the read head to track B 304 and read the reallocated sector 308 during a second read. The DSD may then move the read head back to track A and perform a third read starting at sector 312, immediately following the bad sector 306. The sectors are retrieved in consecutive LBA order, but there may be significant delays associated with repositioning the head and performing three read operations.

Another approach may be to read all the valid requested sectors (e.g. not including bad sectors) from track A 302 prior to reading the reassigned sector 308 from track B 304. In an example embodiment, a skip mask may be used to skip over the bad sector 306 without interrupting the first read. A skip mask may include hardware or data structures configured to control which sectors are read and which sectors are skipped over. For example, a set of registers may be programmed to indicate which sectors to read and which sectors to skip, such by as storing a "1" bit value for sectors to read and a "0" bit value for sectors to skip. The registers may control activation of read gates used to control when a read head is activated. Bit strings stored to a memory or other structures may also be used to implement a skip mask.

When a read operation is initiated (e.g. via receiving a read request from a host), the DSD may compare the requested LBAs to a look up table (LUT), such as a mapping table or bad sector list, to determine whether any of the requested LBAs has been reassigned. When a reassigned sector is included in the requested LBA range, the DSD may be configured to generate a skip mask to control which sectors are retrieved during the read operation. In this manner, a first read may include reading up to sector 310, skipping over bad sector 306 without interrupting the read, and resuming the read at sector 312. If necessary, a second read can be performed to retrieve data from the reallocated sector 308. In this manner, a number of reads employed to retrieve the LBA range of Track A 302 may be reduced from three to at most two. A skip mask may also allow a DSD to skip over a plurality of non-contiguous reallocated sectors.

A number of reads may be further reduced by employing error correction techniques to eliminate the need to perform a separate read operation for the reallocated sector 308. Certain error correction techniques can be used to detect and correct errors in read data. For example, outer code correction techniques may include storing parity data across a track (e.g. in sectors devoted to storing parity data for the entire track) which can be used recover bits or entire sectors of the track that were not read successfully, for example due to errors. A number of errors or sectors that can be recovered may depend on the amount of parity data stored, and may be a known value (e.g. six sectors). Some error correction schemes capable of recovering failed sectors (e.g. sectors that were not read successfully) may include reading an entire track of data to retrieve the parity data stored across the track.

Rather than just using error correction to recover sectors that failed to read due to errors, the error correction code (ECC) can also be used to reconstruct skipped sectors, such as the reassigned data from bad sector 306. Accordingly, when a read operation is initiated for an LBA range including a reallocated sector, the DSD may attempt to reconstruct data from the reallocated sector 308 rather than performing a dedicated read to recover the sector, which may improve overall response time. In embodiments where the ECC requires reading a full track, the reassigned sector recovery may be performed when the entire track has been requested for the read operation. Alternately, if less than a full track is requested, the DSD may modify the read operation to read the entire track when the LBA range includes a reassigned sector in order to attempt ECC-based data recovery for the reassigned sector. A method of minimizing reads for reallocated sectors is described in further detail in regard to FIG. 4.

Figure 4:
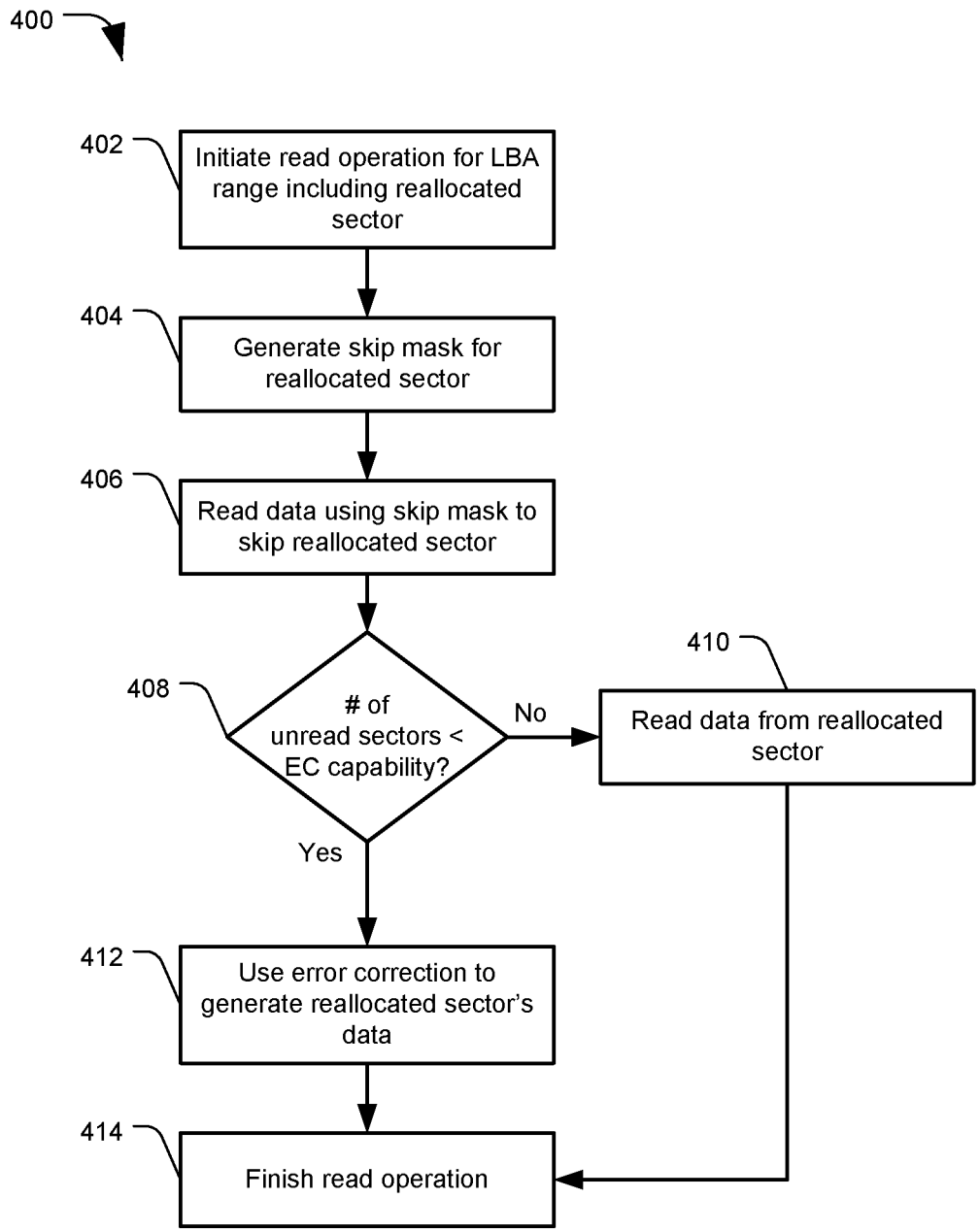
FIG. 4 is a flowchart of a method of minimizing reads for reallocated sectors, in accordance with certain embodiments of the present disclosure.

FIG. 4 is a flowchart of an example method 400 of minimizing reads for reallocated sectors, in accordance with certain embodiments of the present disclosure. The method 400 may be performed by one or more components of a data storage device (DSD), such as an error recovery module (ERM).

The method 400 may include initiating a read operation for an LBA range including one or more reallocated sectors, at 402. A read operation may be a process to retrieve a selected LBA range, and may include one or more reads. A read operation may be initiated in response to receiving a read request from a host device, as part of diagnostics operations, for copying or reading data for data redundancy purposes, or in response to other trigger events. The DSD may access mapping tables or other information regarding reallocated sectors to determine whether the LBA range of the read includes a reallocated sector.

A skip mask may then be generated to skip over the one or more reallocated sectors without interrupting a read, at 404. For example, set of registers may be programmed to indicate which sectors of a track to read, and which sectors to skip over without reading. The method 400 may include reading data from a track at 406, using the skip mask to skip over one or more reallocated sectors along the track. The read operation may include reading all sectors of the track when a reallocated sector is included in the LBA range of the current track, whether or not all sectors on the track are included in the LBA range of the read. For example, some error recovery operations may function based on reading parity data distributed across the track, and application of the error recovery operations may be anticipated when a reallocated sector is to be skipped.

At 408, a determination may be made whether a number of unread sectors is less than an error correction (EC) capability of the applicable error correction code scheme. Unread sectors may include skipped reallocated sectors, as well as sectors that were not read successfully, for example due to read errors encountered at those sectors. A DSD may be capable of recovering a known number of unread sectors, referred to here as the EC capability, with a given error correction scheme. If the number of unread sectors exceeds the EC capability, the DSD may be unable to recover any of the unread sectors using the recovery scheme. However, reallocated sectors may still be successfully read if an additional read is performed to retrieve the sector at its reassigned location, which may reduce the number of unread sectors and allow the DSD to successfully recover the data from sectors that failed due to read errors.

Accordingly, if the number of unread sectors is not lower than the EC capability, at 408, the method 400 may include reading the data from the reallocated sector, at 410, and finishing the read operation, at 414.

If the number of unread sectors is lower than the EC capability, at 408, the method 400 may include using error correction to generate the data from the reallocated sector, at 412, eliminating a need to perform an additional read to obtain the reallocated data. For example, using parity data stored to the target track of the current read, the DSD may be able to mathematically reconstruct the data that was stored to the one or more reallocated sectors without additional reads, and therefore improve the response time of the read operation and the functioning of the DSD. For example, reconstructing the reallocated sector using error correction schemes may reduce a number of reads required to read an LBA range having a single reallocated sector from three or two down to one. The method 400 may include finishing the read operation, at 414. Another method of performing an uninterrupted read without including reallocated sectors is discussed in regard to FIGS. 5 and 6.

Figure 5:
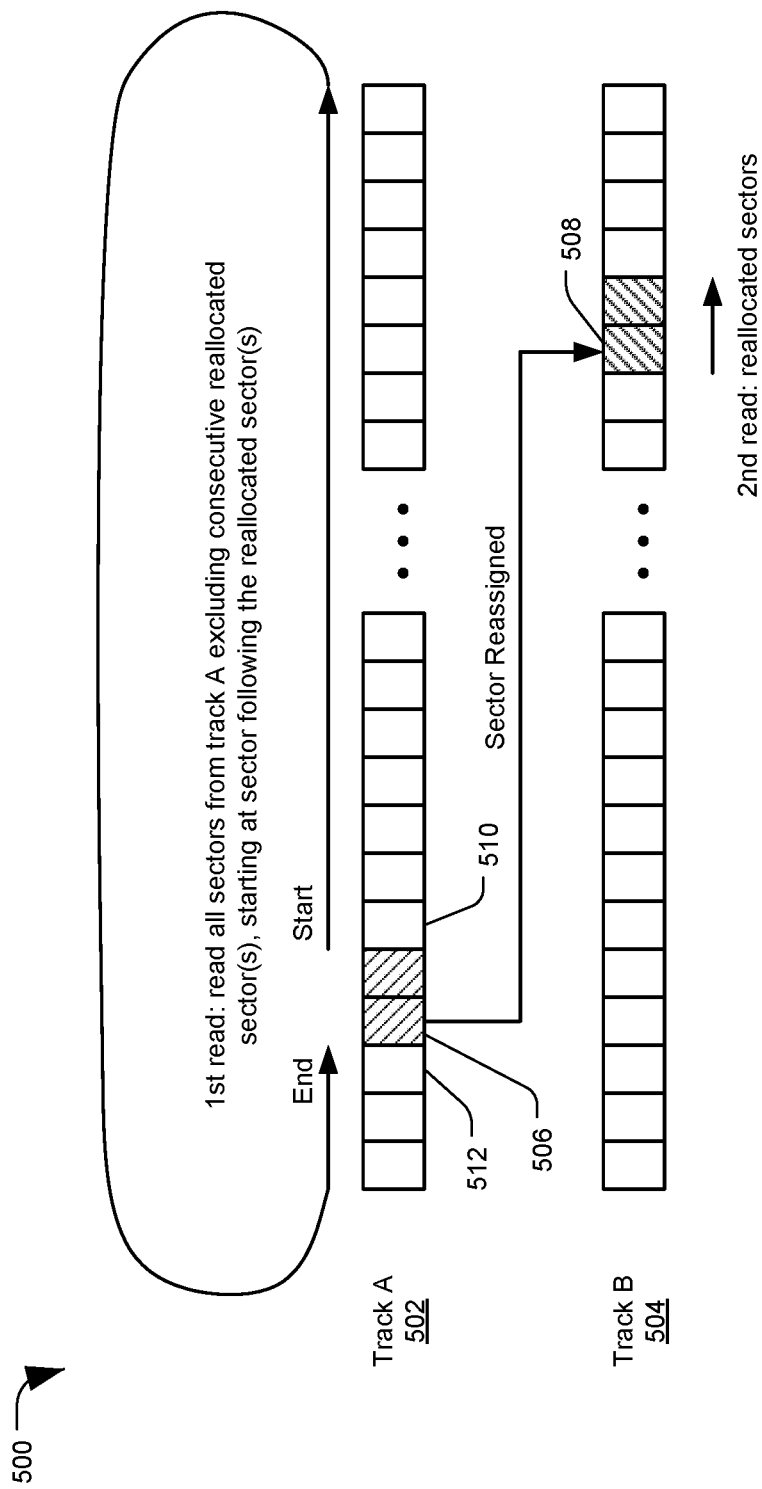
FIG. 5 is a diagram of a system configured to minimize reads for reallocated sectors, in accordance with certain embodiments of the present disclosure.

FIG. 5 is a diagram of a system configured to minimize reads for reallocated sectors, in accordance with certain embodiments of the present disclosure. FIG. 5 depicts an example set of tracks 500 of a data storage medium, which may correspond to the tracks discussed in regard to FIG. 3.

Two tracks, Track A 502 and Track B 504, are depicted in the embodiment of FIG. 5. Track A 502 may include sectors having contiguous LBA values, while track B 504 may include spare sectors and reallocated sectors from other locations on the storage medium. Two contiguous sectors 506 of track A 502 may be bad, and have been reassigned to sectors 508 of track B 504.

As with FIG. 3, a read operation may be directed to a selected LBA range on track A 502 including the bad sectors 506. Rather than employing a skip mask to begin a read before the bad sectors 506 and then skip over the bad sectors 506, the read operation may instead be modified to begin after the bad sectors 506, at sector 510. The read may then read all the sectors of track A 502 until the disc medium has completed a full revolution, with the read ending at the last sector 512 before the bad sectors 506. By modifying the read operation to commence after the bad sectors 506, DSD architecture may not need to be included for generating and applying a skip mask during reads. Instead, DSD firmware can identify reallocated sectors prior to starting a read, and then program a set of registers based on the location of the reallocated sectors to specify start and end locations for raising the read-gate. Further, by reading all sectors on the track A 502, error code data can be retrieved for use in reconstructing the data from the reassigned sectors 508. A single reallocated sector, or multiple contiguous reallocated sectors can be excluded from the read. A method of performing the process of FIG. 5 is further described in regard to FIG. 6.

Figure 6:
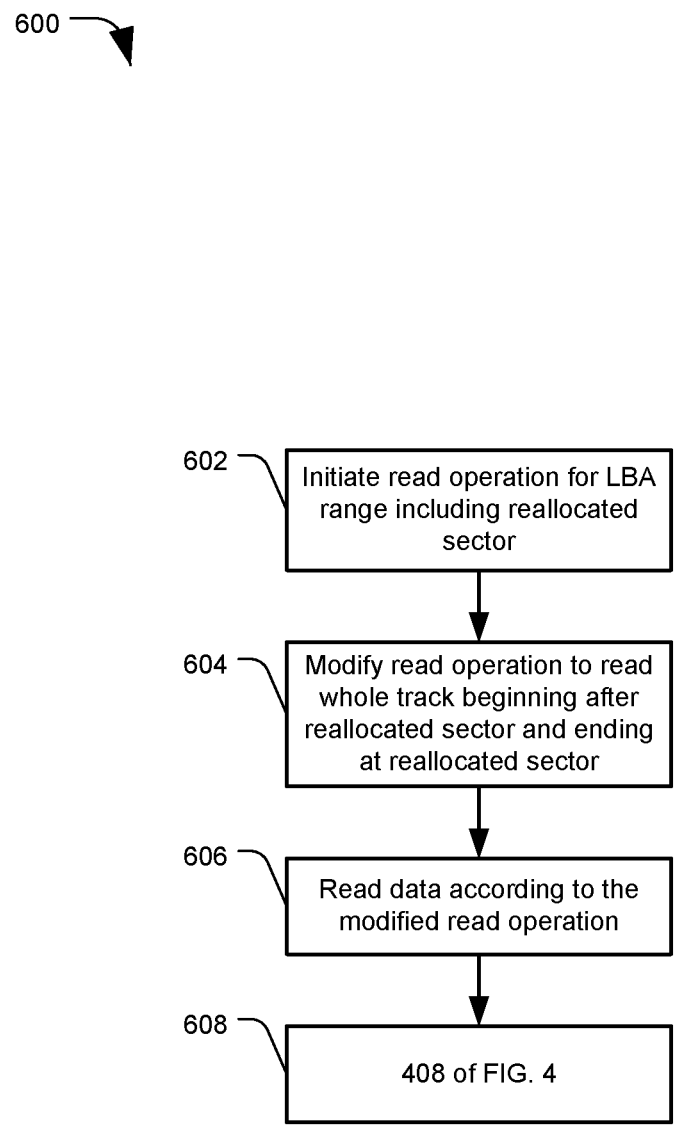
FIG. 6 is a flowchart of a method of minimizing reads for reallocated sectors, in accordance with certain embodiments of the present disclosure.

FIG. 6 is a flowchart of an example method 600 of minimizing reads for reallocated sectors, in accordance with certain embodiments of the present disclosure. The method 600 may be performed by one or more components of a data storage device (DSD), such as an error recovery module (ERM).

Method 600 may include initiating a read operation for an LBA range including one or more contiguous reallocated sectors, at 602. For example, a host may request LBA range 1-100, which LBA range is included on a single data track of a storage medium of the DSD. LBA 25 may be reassigned to a sector on another track.

At 604, the method 600 may include modifying the read operation to read the whole track containing the LBA range, beginning the read after the bad (reallocated) sector, and ending the read at the reallocated sector (e.g. reading up through the sector preceding the reallocated sector). For example, a read for LBAs 1-100 may normally begin at LBA 1 and proceed through LBA 100. Alternately, a read may begin when a read head has been aligned over the target track, even if that is in the middle of the LBA range (e.g., LBA 12). Rather than initiating the read at these positions, the read operation may be modified to begin at LBA 26, the LBA following the reassigned sector. The read may then proceed through all remaining sectors on the target track, continue through the end of the track, and end at LBA 24, the LBA preceding the reassigned sector. The DSD may be configured to read the entire track, even if the track includes LBAs not in the requested LBA range (e.g., the track includes LBAs 1-250, so the modified read operation would begin at LBA 26, read through LBA 250 and around to LBA 24, even if only LBAs 1-100 were requested). The method 600 may include reading the data for the LBA range according to the modified read operation, at 606. The method 600 may allow the DSD to "skip" reallocated sectors without generating a skip mask.

At 608, the method 600 may continue as described at 408 of FIG. 4, including determining whether data from the reassigned sectors can be generated using error correction data rather than by performing a read at the reassigned sectors.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a circuit configured to:
        perform a read operation on a logical block address (LBA) range, including selectively not reading one or more reallocated sectors of the LBA range;
        determine whether a number of sectors not read from the LBA range is less than an error correction capability of an error correction scheme used to encode data of the LBA range;
        when the number of sectors not read is less than the error correction capability, generate reconstructed data by reconstructing data of the one or more reallocated sectors using error correction data and do not read the data stored to the one or more reallocated sectors;
        generate modified read data corresponding to the LBA range including data read from the LBA range combined with the reconstructed data; and
        providing the modified read data based on the read operation.

2. The apparatus of claim 1 comprising the circuit further configured to:
    read the one or more reallocated sectors when the number of sectors not read is greater than the error correction capability.

3. The apparatus of claim 1 comprising the circuit further configured to:
    compare the LBA range to a lookup table (LUT) listing reallocated sectors to determine whether the LBA range includes the one or more reallocated sectors.

4. The apparatus of claim 3 comprising the circuit further configured to:
    generate a skip mask to selectively not read the one or more reallocated sectors.

5. The apparatus of claim 3 further comprising:
    selectively not reading the one or more reallocated sectors includes:
        begin the read operation on a sector immediately following the one or more reallocated sectors; and
        read all sectors on a data track including the LBA range during the read operation, ending at a sector immediately preceding the one or more reallocated sectors.

6. The apparatus of claim 5 further comprising the one or more reallocated sectors includes a plurality of consecutive reallocated sectors.

7. The apparatus of claim 1 further comprising:
    sectors not read include sectors that failed to read successfully and the one or more reallocated sectors.

8. The apparatus of claim 1 further comprising:
    the error correction data includes outer code data stored to sectors of a selected track including the LBA range.

9. The apparatus of claim 1 further comprising a hard disc drive, including:
    an interface configured to connect to a host device;
    a disc storage medium having multiple data tracks;
    the LBA range is stored to a first track of the disc storage medium;
    the data of the one or more reallocated sectors is stored to one or more other tracks of the disc storage medium, wherein generating the reconstructed data without reading the data of the one or more reallocated sectors improves data access times of the apparatus by eliminating a need to reposition a read head from the first track to the one or more other tracks to retrieve reallocated sectors;
    the circuit includes a controller configured to:
        implement a spare sector reallocation scheme to reallocate an LBA from a sector having defects to a spare sector;
        perform the read operation in response to receiving a read request from the host device via the interface; and
        provide the modified read data to the host via the interface in response to the read request.

10. A method comprising:
    receiving a read request at a data storage device from a host for a logical block address (LBA) range;
    performing a read operation to retrieve first data from sectors stored to a first data track and corresponding to the LBA range, including selectively not reading a reallocated sector of the LBA range reassigned to a second data track;
    determining whether a number of sectors not read from the LBA range is less than an error correction capability of the data storage device;
    when the number of sectors not read is less than the error correction capability, generating reconstructed data by reconstructing data of the reallocated sector using error correction data and not utilizing data stored to the reallocated sector;
generating modified read data corresponding to the LBA range including the first data combined with the reconstructed data; and
providing the modified read data to the host to correspond to the read request.

11. The method of claim 10 further comprising:
reading the reallocated sector when the number of sectors not read is greater than the error correction capability.

12. The method of claim 10 further comprising:
comparing the LBA range to a lookup table (LUT) listing reallocated sectors to determine whether the LBA range includes the reallocated sector.

13. The method of claim 12 further comprising:
when the LBA range includes one or more reallocated sectors, generating a skip mask to identify the one or more reallocated sectors to selectively not read, including the reallocated sector.

14. The method of claim 12 further comprising:
reading all sectors not except the reallocated sector on a data track including the LBA range during the read operation, including:
  beginning the read operation on a sector immediately following the reallocated sector; and
  ending the read operation at a sector immediately preceding the reallocated sector.

15. The method of claim 10 further comprising:
sectors not read include sectors that failed to read successfully and reallocated sectors selectively not read, including the reallocated sector.

16. The method of claim 10 further comprising:
the error correction data includes outer code data stored to sectors of the first data track including the LBA range.

17. An apparatus comprising:
a circuit configured to:
  perform a read operation on a logical block address (LBA) range of sectors;
  selectively not read a reallocated sector of the LBA range, including:
    modify a starting point of the read operation to begin on a sector immediately following the reallocated sector;
    continue reading all sectors on a data track including the LBA range during the read operation, ending the read operation at a sector immediately preceding the reallocated sector;
  generate modified read data corresponding to the LBA range including data read from the LBA range and reconstructed data from the reallocated sector that was not read; and
  provide the modified read data based on the read operation.

18. The apparatus of claim 17, further comprising: a hard disc drive, including:
an interface configured to connect to a host device; a disc storage medium having multiple data tracks; and the circuit, including a read channel circuit configured to perform the read operation in response to receiving a read request from the host device via the interface.

19. The apparatus of claim 17 comprising the circuit further configured to:
determine whether a number of sectors not read from the LBA range is less than an error correction capability of an error correction scheme used to encode data of the LBA range; and
when the number of sectors not read is less than the amount of sectors that can be recovered, reconstruct data of the reallocated sector using error correction data and do not read the data of the reallocated sector.

20. The apparatus of claim 19 further comprising:
sectors not read include sectors that failed to read successfully and reallocated sectors selectively not read, including the reallocated sector.

* * * * *